United States Patent [19]
Liao

[11] Patent Number: 5,904,767
[45] Date of Patent: May 18, 1999

[54] NEUTRON TRANSMUTATION DOPING OF SILICON SINGLE CRYSTALS

[75] Inventor: Chungpin Liao, Chutung, Taiwan

[73] Assignee: Industrial Technology Research Institute, Hsin-Chu, Taiwan

[21] Appl. No.: 08/705,462

[22] Filed: Aug. 29, 1996

[51] Int. Cl.$^6$ .............. C30B 15/02; C30B 29/06
[52] U.S. Cl. ................ 117/13; 117/19; 117/20; 117/935
[58] Field of Search ............... 117/935, 13, 19, 117/20

[56] References Cited

U.S. PATENT DOCUMENTS 4,910,156  3/1990  Takasu et al. ............... 437/17
5,212,100  5/1993  Groves et al. ............... 437/17

*Primary Examiner*—Robert Kunemund
*Attorney, Agent, or Firm*—George O. Saile; Stephen B. Ackerman

[57] ABSTRACT

A working recipe for NTD CZ and MCZ silicon wafer production is provided. It teaches that a neutron-enhanced S-curve can be constructed by noting that a silicon interstitial ($Si_I$), emitted due to volume change during the traditional oxygen precipitation, can join a neutron-created vacancy in facilitating further oxygen loss via precipitation. The former relation is: $2Si+2O_I \rightarrow SiO_2+Si_I$, the latter is: vacancy+$Si_I+2O_I \rightarrow SiO_2$. The total loss of oxygen interstitials is:

$$\Delta[O_I]=\text{Max}([O_I]_0,\Delta[O_I]_s+\min\{2([Si_I]_s+[Si_I]_0),[\text{vacancy}]\}),$$

with subscripts 0 and s standing for initial state and S-curve prediction, respectively; $[Si_I]_s$ equal to $0.5\Delta[O_I]_s$, and [vacancy] readily obtainable by computer simulation. [vacancy] is a function of the cadmium ratio (CR), silicon sample thickness, and total neutron fluence. The final oxygen interstitial content is: $[O_I]_f = \max\{[O_I]_0 - \Delta[O_I], 0\}$. Evidence for the effectiveness of the recipe taught by the present invention is provided in the form of characterization results derived from MOS capacitors and PN junctions built upon wafers produced according to the recipe. These show that the nominal minority carrier lifetime, interface density, and leakage currents under reverse bias are the same as those from a blank prime wafer.

12 Claims, 3 Drawing Sheets

NEUTRON TRANSMUTATION DOPING OF SILICON SINGLE CRYSTALS

BACKGROUND OF THE INVENTION (1) Field of the Invention

The invention is in the general field of semiconductor doping, more specifically neutron transmutation doping (NTD).

(2) Description of the Prior Art

The most widely used method for the production of silicon ingots for the semiconductor industry is the Czochralski (CZ) method. In the CZ method, super pure silicon is melted in a silica crucible, a single crystal silicon seed is lowered into the melt and then slowly withdrawn. Some liquid silicon is withdrawn along with the seed, because of surface tension, and then solidifies in the slightly cooler environment above the melt. Depending on rate of withdrawal and other factors, high quality silicon single crystals with diameters up to about 12 inches and lengths to about 40 inches are routinely produced in this way.

In general, the resistivity of CZ crystals is higher than desired for semiconductor manufacturing purposes and a dopant, such as phosphorus, may be added to the melt to lower the resistivity. A number of problems are associated with this method of controlling the resistivity of silicon ingots, notably those of non-uniformity. In general, it is found that the doping level can vary substantially both along the length of the ingot as well as along its cross-section. A certain amount of improvement in the latter distribution has been achieved in the Magnetic Czochralski (MCZ) method wherein crystal growth takes place in the presence of a longitudinal magnetic field (typically between about 500 and 4,000 Gauss). Since molten silicon is an electrical conductor, convection currents in it will tend to follow the lines of magnetic force. However, although the MCZ method offers some improvement, the basic problems of non-uniform distribution of dopant remain.

Silicon has an atomic number of 14 and an atomic weight of 28. However, naturally occurring silicon is not entirely made up of the $Si^{28}$ isotope. It turns out that $Si^{29}$ is present at a concentration of about 4.7 atomic % and $Si^{30}$ is present at a concentration of about 3.1 atomic %. Additionally, it turns out that $Si^{30}$, when bombarded by thermal neutrons, is transmuted to phosphorus $p^{31}$ (atomic number 15). Since the desired level of phosphorus doping is well below the 3.1 at. % of the already present $Si^{30}$, it is apparent that a limited amount of neutron bombardment of naturally occurring silicon, will result in the introduction of phosphorus dopant into the silicon. Such phosphorus dopant will be uniformly distributed and will also be in substitutional position in the lattice where it can act as a donor.

This method of doping CZ and MCZ silicon ingots has been described in the prior art by, for example, Takasu et al. (U.S. Pat. No. 4,910,156 March 1990). The neutron sources available outside the nuclear weapons industry all provide slow (thermal) neutrons (ideally having energies around 0.025 eV). These sources include pool type reactors, producing neutrons directly, proton cyclotrons, and proton linear accelerators. The proton generators are in general more convenient to use as the proton stream can be magnetically steered. The fast protons that these generators produce are converted to fast neutrons by causing them to pass through a material such as beryllium, tungsten, or uranium. These fast neutrons are then slowed to become thermal neutrons by surrounding moderators, such as heavy water ($D_2O$).

While neutron transmutation doping (NTD) is an ideal way to achieve uniform phosphorus doping, CZ silicon crystals doped by the NTD method normally do not end up with the expected results. Oxygen interstitials are commonly present within CZ and MCZ silicon crystals as an unintended impurity, which actually comes from the silica crucible itself. Oxygen interstitials are desirable for the manufacture of microelectronic devices owing to several salient features, such as facilitating intrinsic gettering of VLSI process-induced impurities and hardening substrate material against thermal stresses. However, excessive oxygen precipitation (i.e. silica formation) tends to be induced by neutron bombardment of the NTD method and this causes the resulting resistivity to be quite unpredictable. In some cases, total oxygen precipitation even occurred. Excessive oxygen precipitation within the silicon substrate leads to undesirably short minority carrier lifetimes and thus unacceptably large leakage currents of microelectronic devices under reverse bias.

In order for the NTD method to be successfully applied to CZ silicon crystals, the working recipe of the present invention must be known. This covers the initial oxygen content of the CZ silicon crystal, neutron energy spectrum, and neutron fluence (total accumulated number of impinging neutrons per sq. cm.). Without such know-how, the resulting NTD CZ silicon crystals are of unpredictable quality. It is suspected that, due to such a lack of knowledge, Takasu et al. (U.S. Pat. No. 4,910,156 March 1990) proposed using several non-traditional infrared probing techniques for NTD CZ wafer quality control and assurance. NTD wafers with low infrared transparency failed to become prime wafers. However, with the working recipe of the present invention, good product NTD CZ prime wafers can be assured and the non-traditional infrared probing is unnecessary. Also, in the claims made by Takasu et al. the allowed maximum fast neutron fluence was specified based upon its relation to the leakage currents of reverse-biased circuits built on their production NTD wafers. Nonetheless, according to experiments guided by the recipe of the present invention, the fast neutron vs. leakage current (in arbitrary units) relation of Takasu et al. was simply incorrect. Additionally, the partition between fast and slow neutrons is rather vague (in Takasu et al.) but this turns out to be a very important parameter (as is taught by the present invention).

We should also note that NTD has been used to dope individual silicon wafers, as opposed to full ingots. See for example Groves et al. (U.S. Pat. No. 5,212,100 May 1993) but the same problems relative to oxygen precipitation will still apply. The present invention, which we will describe in detail below, has been able to use NTD in a manner that not only leads to uniform phosphorus doping but also successfully avoids the very serious excessive oxygen precipitation problem.

SUMMARY OF THE INVENTION

It has been an object of the present invention to provide an improved method for the neutron transmutation doping of CZ silicon.

Another object of the present invention is to provide an improved method for avoiding the excessive precipitation problem occuring in neutron transmutation doping of a single crystal of silicon.

Yet another object of the present invention is to provide an improved method for minimizing the electrical effects of oxygen precipitation in a single crystal of silicon.

A still further object of the present invention is to provide a single method that combines both neutron transmutation doping and improved oxygen control.

An additional object of the present invention is to provide an apparatus for the implementation of said method.

A practical object of the present invention is to allow the use of more easily accessible low thermal-to-fast ratio irradiation facilities on CZ silicon.

These objects have been achieved by providing a working recipe for successful NTD of CZ silicon crystals. The recipe, called the neutron enhanced S curve, or n-S curve, shows how to match CZ silicon single crystals having a certain initial oxygen content with a specific neutron source of known cadmium ratio (CR) (thermal-to-fast neutron ratio), given a typically large irradiation fluence (above $10^{18}$ cm$^{-2}$). Although partition of fast and thermal (slow) neutrons is crucial to the present invention, it is, however, impractical to narrowly define fast and thermal neutrons from the continuous energy spectrum of a typical neutron source.

It should be noted that, according to the n-S surve of the present invention (when lots of vacancies are created by the fast component of a low CR neutron source), for a CZ silicon single crystal having a very common initial oxygen content around 9 to 14 ppma, use of low CR (in practice between 5 and 20) neutron sources can produce satisfactory NTD CZ silicon crystals. Thus, excessive oxygen precipitation can be readily avoided by simply applying the more accessible low CR (i.e. high fast neutron fraction) neutron source. Also, leakage current problems observed in the prior art of Takasu et al. did not occur. Usually, high CR (around 100 to 5,000) sources are harder to obtain. The conventional reason for using high CR sources for NTD CZ silicon has been that the fast neutron component tends to damage the silicon single crystal lattice and thus create nucleation centers for excessive oxygen precipitation.

DESCRIPTION OF THE PREFERRED EMBODIMENTS

In the absence of neutron irradiation, the principal mechanism whereby oxygen in silicon precipitates out (during the heat treatments discussed earlier) is believed to be $$2Si + 2O_I \rightarrow SiO_2 + Si_I \ldots \quad (1)$$

where subscript I denotes 'interstitial'

Figure 1:
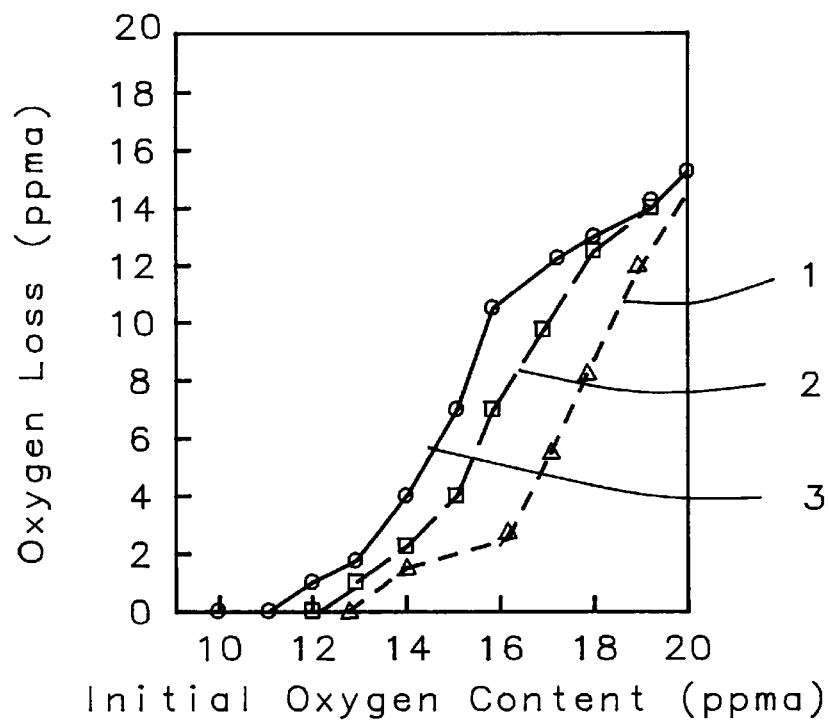
FIG. 1 shows a typical "S curve" of oxygen loss vs. initial oxygen content for a non-NTD CZ crystal that has undergone typical thermal cycling.

FIG. 1 is a classical 'S-curve' showing oxygen lost in parts per million atomic (ppma) vs initial oxygen content, for non NTD CZ prime wafers that have undergone several typical heating cycles: curve 1 in FIG. 1 is for a treatment of 800° C. for 1 hour followed by 1,050° C. for 8 hours, curve 2 is for 800° C. for 2 hours followed by 1,050° C. for 15 hours, and curve 3 is for 750° C. for 4 hours followed by 1,050° C. for 16 hours. As can be seen, the full amount of oxygen within ordinary CZ prime wafers does not precipitate out during the typical thermal cycles of the microelectronic manufacturing process, particularly when the initial oxygen content is fairly low.

When associated with neutron irradiation, there is another mechanism which can also have a significant effect. This is $$vacancy + Si_I + 2O_I \rightarrow SiO_2 \ldots \quad (2)$$

If the proper recipe is not followed, application of the NTD method to CZ silicon crystals can easily lead to undesired excessive oxygen precipitation by the process of equation (2).

The present invention provides a recipe for NTD CZ silicon wafer production. It teaches that a "neutron-enhanced S-curve" (or n-S curve, see FIG. 4) can be constructed by noting that a silicon interstitial (Si$_I$), emitted due to volume change during the traditional oxygen precipitation (see equation (1)), can join a neutron-created vacancy in facilitating further oxygen loss via precipitation (see equation (2)). As taught by the present invention, the total loss of oxygen interstitials is:

$$\Delta[O_I] = Max([O_I]_0 \Delta[O_I]_s + \min\{2([Si_I]_s + [Si_I]_0), [vacancy]\}),$$

with subscripts 0 and s standing for initial state and S-curve prediction, respectively; $[Si_I]_s$ equal to $0.5\Delta[O_I]_s$, and [vacancy] being readily obtainable from MCNP (Monte Carlo N Particle) computer simulation (available from Oak Ridge National Laboratory, Oak Ridge, Tenn.) or from the CASTEP code of the MSI Company, USA. [vacancy] is a function of the cadmium ratio, silicon sample thickness, and total neutron fluence. The worst oxygen loss occurs when $[vacancy] > [Si_I]_{s+0}$, due to the use of a lower CR source. Under this condition, the final oxygen interstitial content is: $[O_I]_f = \max\{[O_I]_0 - \Delta[O_I], 0\}$, and is depicted by the n-S curve.

Figure 4:
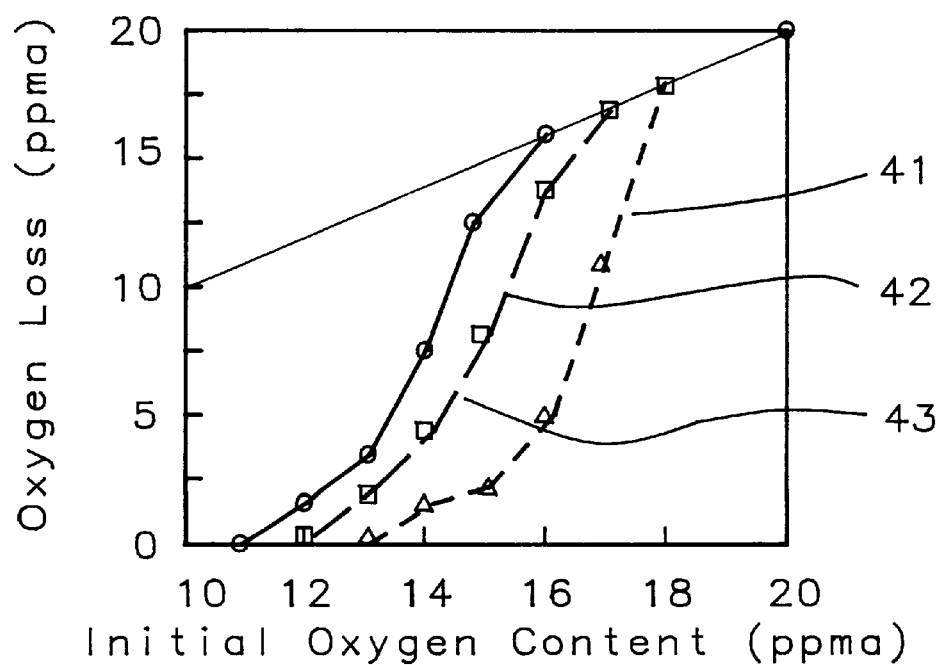
FIG. 4 is a (n-S) curve of oxygen loss vs. initial oxygen content for a NTD CZ crystal treated according to the method of the present invention.

An important implication is that even under such conditions, for the most common $[O_I]_0 = 9–14$ ppma, very few oxygen losses would result (see FIG. 4). Experiments conducted for this case indicated that excessive oxygen precipitation did not materialize. Further, characterization results derived from MOS capacitors and PN junctions built on these production NTD CZ wafers also showed that the nominal minority carrier lifetime (see Table 1) interface density and leakage currents under reverse bias (see Table 2) were the same as those from a blank prime wafer. Thus the present invention is able to apply the NTD method in such a way that not only uniform phosphorus doping can be achieved, but also the much concerned excessive oxygen precipitation phenomenon can be avoided.

Figure 2:
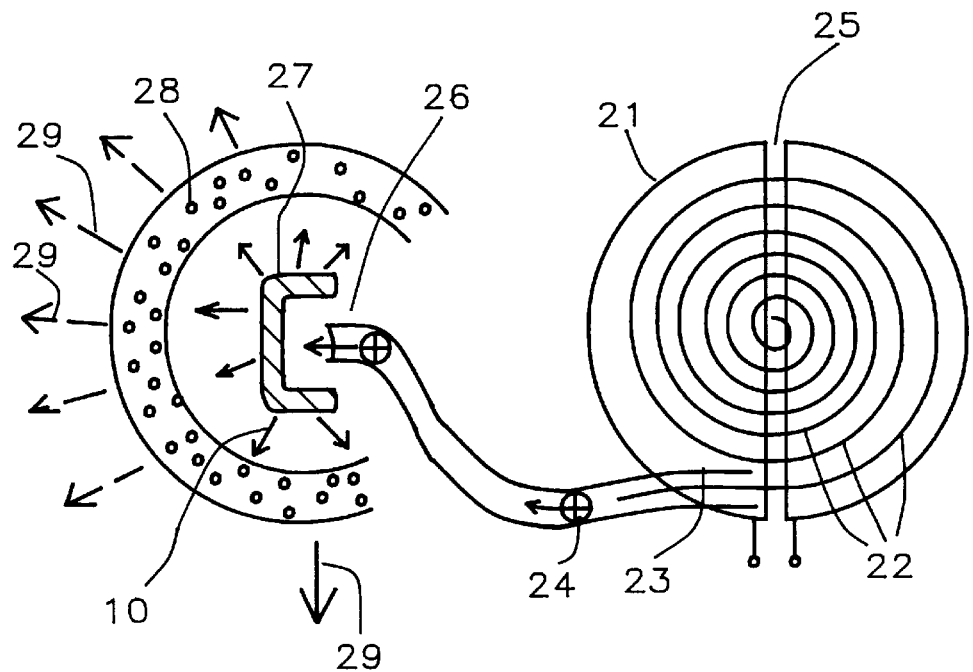
FIG. 2 shows the main components of a neutron source of the type used by the present invention.

Research type nuclear reactors are not the only source of neutrons. Referring now to FIG. 2, we show the main components of an alternative slow neutron source of the type to be used by us. It will be understood that similar modifications to other, normally fast, neutron sources could be made without departing from the spirit of the present invention. In cyclotron 21, protons follow spiral orbits, such as 22, being accelerated each time they cross separator 25 between the two dees. In due course high energy protons (such as 24) arrive at and exit via conduit 23. They are magnetically steered (magnets not shown) along 23, emerging into air at exit port 26.

High energy protons emerging at 26 then pass through a layer of material 27 (typically between about 0.1 and 1 cm. thick) such as beryllium, tungsten or uranium, which converts them to fast neutrons, such as 10. These fast neutrons then pass through layer 28 of a moderator such as water, heavy water (D$_2$O), graphite, etc. which surrounds 26 and 27. The planned thickness value of our moderator will be the minimum required to reach the desired cadmium ratio of the neutron source on the far side of the moderator layer.

The cadmium ratio of a specific neutron source, meaning thermal to fast neutron number ratio proper, is rigorously defined as follows: If the accumulated gamma ray counts detected by a typical Geiger counter for a time period of a neutron irradiated gold foil is denoted A, and that of a neutron irradiated same size gold foil enclosed within a 0.5 mm. thick cadmium foil is denoted B, then the cadmium ration (CR) is defined as (A–B)/B. In A, the gold activitation is caused by both thermal and fast neutrons, while in B thermal neutrons are mostly absorbed by the cadmium layer and the gold activation is mostly due to the fast neutrons.

Figure 3:
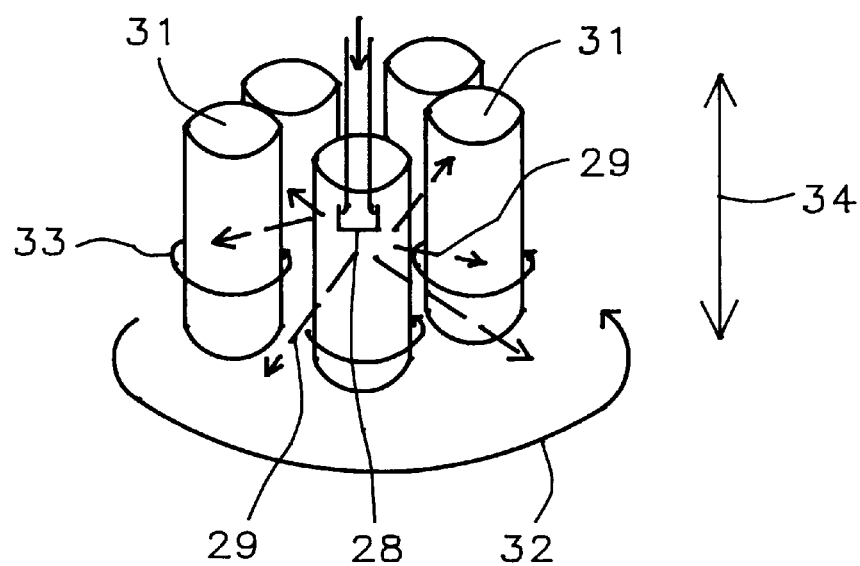
FIG. 3 shows an apparatus for the neutron irradiation of silicon ingots.

In FIG. 3 we show how the alternative slow neutron source of FIG. 2 can be utilized for performing NTD on CZ silicon ingots (such as 31). These latter are arranged so that they surround moderating layer, or source, 28, thereby ensuring that they will be subjected to bombardment by slow neutrons, such as 29. In order to ensure that this neutron bombardment is uniformly and equally applied to all ingots such as 31, means (not shown) are provided for causing ingots 31 to revolve around source 28 (orbit 32), for causing all ingots to rotate on their own axes (orbits such as 33), and for translationally moving all ingots relative to source 28 (directions 34).

The present invention, using the apparatus shown in FIGS. 2 and 3 or a nuclear reactor irradiation facility, may be applied to silicon single crystals grown by either the CZ or the MCZ methods. Crystals produced in this way, in conjunction with the teachings of the present invention, will allow the effective control of oxygen content and phosphorus doping.

In both cases, the total neutron fluence is between about $5 \times 10^{17}$ and $1 \times 10^{19}$ neutrons/cm.$^2$ and the period of time for which ingots are irradiated is between about 5 hours and 10 days for a neutron source with a flux of $10^{14}$/cm$^2$.sec. The method is effective for silicon ingots with diameters between about 2 and 30 inches and lengths between about 1 and 150 cm. For ingots with diameters greater than 8 inches it is preferable to process cut ingot chunks each about 20 cm. in length with the cross-sections facing the neutron flux (see FIG. 5) to avoid neutron flux attenuation.

Referring now to FIG. 4, we show the curve of oxygen loss vs. initial oxygen content for silicon single crystals that have subjected to NTD according to the teachings of the present invention. Curve 41 corresponding to curve 1 in FIG. 1 is for a treatment of 800° C. for 1 hour followed by 1,050° C. for 8 hours, curve 42, corresponding to curve 2 in FIG. 1, is for 800° C. for 2 hours followed by 1,050° C. for 16 hours, while curve 43, corresponding to curve 3 in FIG. 1, is for 750° C. for 4 hours followed by 1,050° C. for 16 hours. As can be seen, if the teachings of the present invention are not applied, application of the NTD method to CZ silicon crystals can lead to much more oxygen precipitation as compared to the more desirable case represented by the S-curve of FIG. 1 when without neutron irradiation.

Figure 5:
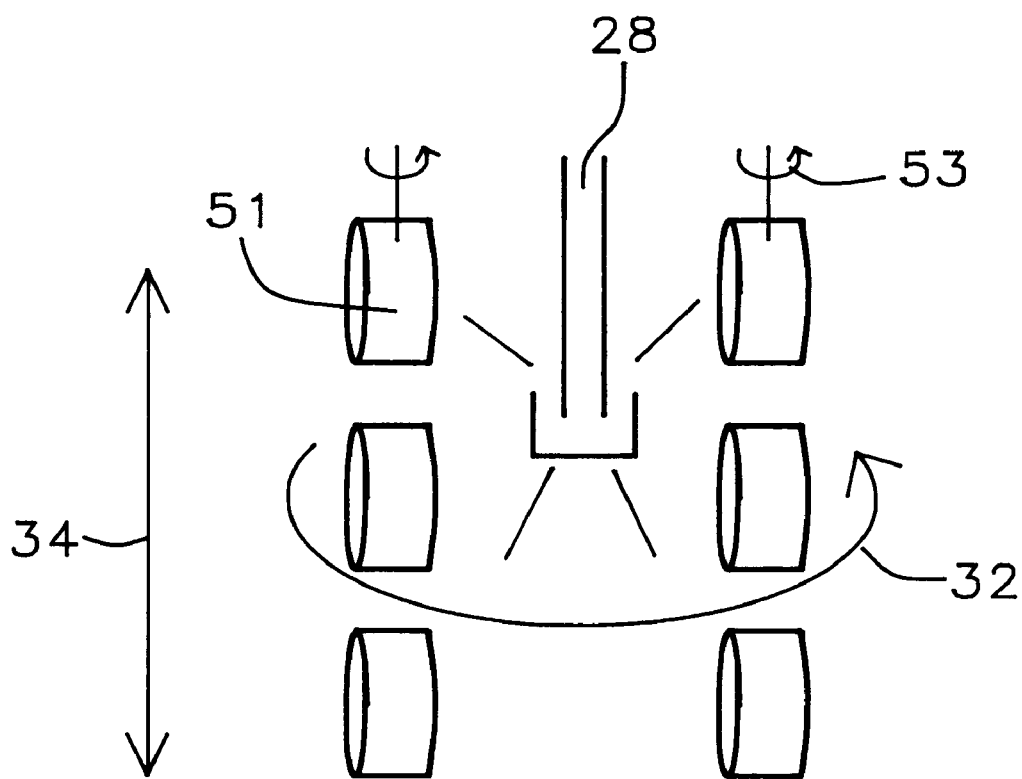
FIG. 5 shows the apparatus of FIG. 3 with ingots divided into chunks with cross-sections facing the neutron flux.

When the diameter of the silicon ingots exceeds about 8 inches, there is the likelihood that some neutron attenuation will occur if the geometry depicted in FIG. 3 is used. Accordingly, for these larger ingots, the ingots are chopped into chunks about 20 cm. thick and arranged around the neutron source so that their cross-sections face the neutron flux, as shown in FIG. 5. In order to ensure that this neutron bombardment is uniformly and equally applied to all chunks such as 51, means (not shown) are provided for causing chunks 51 to revolve around source 28 (orbit 32), for causing all ingots to rotate on their own axes (orbits such as 53), and for translationally moving all ingots relative to source 28 (directions 34).

Additional evidence of the efficacy of the present invention is provided in tables 1 and 2. Table 1 shows the minority carrier lifetime (which is related to the number of recombination sites in the crystal) and the surface generation velocity (which relates to the number of recombination sites on the crystal surface) for several different silicon samples, all of which (except the blank wafer) had been phosphorus doped using NTD according to the teachings of the present invention, and then had received the heat treatments shown. As can be seen, there is no real difference between NTD CZ wafers and the blank wafer in terms of minority carrier lifetime and surface generation velocity.

Table 2 compares junction leakage values (5 volt back bias) for a similar set of samples to those shown in Table 1. $J_{ra}$ is the area current while $J_{rp}$ is the peripheral current. Within experimental accuracy, $J_{rp}$ and $J_{ra}$ of our NTD CZ wafers are essentially the same as those of a blank prime wafer.

TABLE 1

MOS Capacitor Measurement

| Process | NTD 800 C/ 2 h | NTD 900 C/ 0.5 h | NTD 1000 C/ 0.5 h | NTD 1000 C/ 0.5 h | NTD 1000 C/ 0.5 h | blank |
|---|---|---|---|---|---|---|
| Jra (nA/cm$^2$) | 2.0 | 2.2 | 6.4 | 9.3 | 10.3 | 25.0 |
| Jrp (nA/cm) | 12.0 | 10.6 | 9.0 | 0.8 | 4.7 | 1.9 |

TABLE 2

Junction Leakage Measurement

| Process | NTD 800 C/ 2 h | NTD 850 C/ 1 h | NTD 900 C/ 0.5 h | NTD 1000 C/ 0.5 h | blank |
|---|---|---|---|---|---|
| Minority Carrier Lifetime (ms) | 0.83 | 2.14 | 3.48 | 1.84 | 1.97 |
| Surface Gen. Velocity (cm/s) | 14.1 | 17.7 | 13.9 | 17.2 | 25.1 |

While the invention has been particularly shown and described with reference to the preferred embodiments thereof, it will be understood by those skilled in the art that various changes in form and details may be made without departing from the spirit and scope of the invention.

What is claimed is:

1. A method for producing phosphorus-doped silicon comprising:

preparing, by the CZ method, a single crystal silicon ingot having an oxygen content between about $1 \times 10^{17}$ atoms/cm.$^3$ and about $2 \times 10^{18}$ atoms/cm.$^3$; and transmuting silicon isotope Si$^{30}$, naturally contained in said crystal, into phosphorus isotope P$^{31}$ by irradiating the crystal to a total neutron fluence between about $5 \times 10^{17}$ and $1 \times 10^{19}$ neutrons/cm.$^2$, with neutrons of a rigorously defined cadmium ratio between about 5 and 5,000., thereby validating use of an n-S curve, that relates oxygen loss to initial oxygen content, to determine an optimum heat treatment for removal of all active oxygen from solution in said silicon ingot.

2. The method of claim 1 wherein said initial oxygen content is between about 9 and about 14 ppma.

3. The method of claim 1 wherein the diameter of said single crystal silicon ingot is between about 2 and 8 inches.

4. The method of claim 3 wherein the length of said silicon single crystal is between about 1 and 150 cm.

5. The method of claim 1, wherein the diameter of said single crystal silicon ingot is between about 8 and 30 inches, and further comprising:

prior to said neutron irradiation, chopping the ingot into chunks of length about 20 cm.; and positioning said chunks so that their cross-sections face the neutron flux, thereby avoiding neutron flux attenuation.

6. The method of claim 1 wherein said single crystal is in wafer form.

7. A method for producing phosphorus-doped silicon comprising:

preparing, by the MCZ method, a single crystal silicon ingot having an oxygen content between about $1 \times 10^{17}$ atoms/cm.$^3$ and about $2 \times 10^{18}$ atoms/cm.$^3$; and transmuting silicon isotope $Si^{30}$, naturally contained in said crystal, into phosphorus isotope $P^{31}$ by irradiating the crystal to a total neutron fluence between about $5 \times 10^{17}$ and $1 \times 10^{19}$ neutrons/cm.$^2$ with neutrons of a rigorously defined cadmium ratio, between about 5 and 5,000, thereby validating use of an n-S curve, that relates oxygen loss to initial oxygen content, to determine an optimum heat treatment that will remove all active oxygen from solution in said silicon ingot.

8. The method of claim 7 wherein said initial oxygen content is between about 9 and about 14 ppma.

9. The method of claim 7 wherein the diameter of said single crystal silicon ingot is between about 2 and 8 inches.

10. The method of claim 3 wherein the length of said silicon single crystal is between about 11 and 150 cm.

11. The method of claim 7, wherein the diameter of said single crystal silicon ingot is between about 8 and 30 inches, and further comprising:

prior to said neutron irradiation, chopping the ingot into chunks of length about 20 cm.; and positioning said chunks so that their cross-sections face the neutron flux, thereby avoiding neutron flux attenuation.

12. The method of claim 7 wherein said single crystal is in wafer form.

* * * * *